(12) United States Patent
Kawamura et al.

(10) Patent No.: US 7,129,145 B2
(45) Date of Patent: Oct. 31, 2006

(54) METHOD OF MANUFACTURING AN IC COIL MOUNTED IN AN INFORMATION CARRIER

(75) Inventors: Satoshi Kawamura, Yokohama (JP); Shin Shimizu, Kawasaki (JP)

(73) Assignee: Hitachi Maxell, Ltd., Osaka (JP)

( * ) Notice: Subject to any disclaimer, the term of this patent is extended or adjusted under 35 U.S.C. 154(b) by 0 days.

(21) Appl. No.: 10/969,902

(22) Filed: Oct. 22, 2004

(65) Prior Publication Data
US 2005/0051872 A1    Mar. 10, 2005

Related U.S. Application Data

(62) Division of application No. 09/914,077, filed on Aug. 23, 2001, now abandoned.

(60) Provisional application No. PCT/JP00/01029, filed on Feb. 23, 2000.

(30) Foreign Application Priority Data

Feb. 24, 1999   (JP)   ................................. 11-046545
Mar. 8, 1999    (JP)   ................................. 11-059753

(51) Int. Cl.
    *H01L 21/20*    (2006.01)
(52) U.S. Cl. ....................... 438/381; 438/238; 438/460
(58) Field of Classification Search ................ 438/238, 438/329, 330, 381, 382, 384, 460, 462, 463, 438/669, 674; 257/531
    See application file for complete search history.

(56) References Cited

U.S. PATENT DOCUMENTS

| 4,483,067 A | 11/1984 | Parmentier |
| 4,960,983 A * | 10/1990 | Inoue ........................ 235/449 |
| 5,048,179 A | 9/1991 | Shindo et al. |
| 5,308,967 A | 5/1994 | Jurisch |
| 5,399,847 A | 3/1995 | Droz |
| 5,424,527 A | 6/1995 | Takahira |
| 5,598,032 A | 1/1997 | Fidalgo |

(Continued)

FOREIGN PATENT DOCUMENTS

DE    37 21 822 C1   11/1988

(Continued)

OTHER PUBLICATIONS

Patent Abstracts of Japan, vol. 1996, No. 12, Dec. 26, 1996.

(Continued)

*Primary Examiner*—Kevin M. Picardat
(74) *Attorney, Agent, or Firm*—Birch, Stewart, Kolasch & Birch, LLP

(57) ABSTRACT

An information carrier in which an IC element formed integrally with a coil is mounted and which has an extended communication range and a method of manufacturing the same and a structure of the IC element appropriately suited for this sort of information carrier and a method of manufacturing the same. In the IC element, a conductor constituting the coil 3 is implemented in a multilayer structure including a metal-sputtered layer or alternatively a metal-evaporated layer 6 and a metal-plated layer 7. In the method of manufacturing the IC element, a precision electroforming method is employed as a means for forming the metal-plated layer 7. The information carrier is implemented in such a structure in which the IC element 1 is disposed at a center portion in a planar direction of a substrate 21. In a method of manufacturing the information carrier, strip material or materials 41 to 45 a given one of which has mounted thereon desired parts inclusive of the IC elements are manufactured, whereon desired information carriers 20a, . . . , 20h are formed by punching the strip material(s).

5 Claims, 10 Drawing Sheets

U.S. PATENT DOCUMENTS

| | | | |
|---|---|---|---|
| 5,710,458 | A | 1/1998 | Iwasaki |
| 5,837,992 | A | 11/1998 | Onozawa |
| 5,852,289 | A | 12/1998 | Masahiko |
| 5,856,662 | A | 1/1999 | Kohama et al. |
| 6,049,461 | A | 4/2000 | Haghiri-Tehrani et al. |
| 6,160,526 | A | 12/2000 | Hirai et al. |
| 6,176,010 | B1 | 1/2001 | Droz |
| 6,392,297 | B1 * | 5/2002 | Seto ........................... 438/623 |
| 2001/0002874 | A1 | 6/2001 | Sakamoto et al. |
| 2001/0044013 | A1 | 11/2001 | McDonough et al. |

FOREIGN PATENT DOCUMENTS

| | | | |
|---|---|---|---|
| EP | 0 977 145 A2 | | 2/2000 |
| JP | 7-161935 A | | 6/1995 |
| JP | 08222695 | * | 8/1996 |
| JP | 10-203061 | | 8/1998 |
| JP | 10-302040 | | 11/1998 |
| JP | 10-320519 | | 12/1998 |
| JP | 11-17443 | | 1/1999 |
| JP | 11-17443 A | | 1/1999 |
| WO | WO 92/08209 A | | 5/1992 |
| WO | WO-98/26939 A1 | | 6/1998 |
| WO | WO 98/33142 A1 | | 7/1998 |
| WO | WO-98/52772 A1 | | 11/1998 |
| WO | WO-98/59318 A1 | | 12/1998 |

OTHER PUBLICATIONS

Patent Abstracts of Japan, vol. 1998, No. 11, Sep. 30, 1998.
Patent Abstracts of Japan, No. 08222695, (Aug. 30, 1996).
Patent Abstracts of Japan, No. 61094339, (May 13, 1986).
Patent Abstracts of Japan, No. 61016591, (Jan. 24, 1986).
Merriam-Webster Online Dictionary, www.m-w.com.

* cited by examiner

METHOD OF MANUFACTURING AN IC COIL MOUNTED IN AN INFORMATION CARRIER

This application is a Divisional of application Ser. No. 09/914,077 filed on Aug. 23, 2001 now abandoned, and for which priority is claimed under 35 U.S.C. § 120. application Ser. No. 09/914,077 is the national phase of PCT International Application No. PCT/JP00/01029 filed on Feb. 23, 2000, under 35 U.S.C. § 371. The entire contents of each of the above-identified applications are hereby incorporated by reference. This application also claims priority of Application Nos. 11-046545 and 11-059753 filed in Japan on Feb. 24, 1999, and Mar. 8, 1999, respectively, under 35 U.S.C. § 119.

BACKGROUND OF THE INVENTION

1. Field of the Invention

The present invention relates to AN IC element formed integrally with a coil on a chip, a method of manufacturing the IC element, an information carrier incorporating the IC element and a method of manufacturing the information carrier.

2. Description of Related Art

Heretofore, such a contactless type information carrier has been known which includes an IC element mounted internally of a substrate having a predetermined shape and an antenna coil electrically connected to the terminals of the IC element for effectuating in a noncontacting or contactless manner reception of electric power from a reader/writer and a signal transmission/reception with the reader/writer through the medium of the electromagnetic wave. As the information carriers of this species, there may be mentioned those referred to as the card-like information carriers, the coin-like information carriers, the button-like information carriers and the like named after the external appearance.

As the information carriers of the types mentioned above, the information carrier having an antenna coil patterned on a substrate or the information carrier having an antenna coil composed of a coil carried on a substrate has heretofore been employed. However, in recent years, there has been proposed an information carrier in which the IC element formed integrally with the antenna coil is mounted on the substrate and which features the capability of being manufactured inexpensively without need for the protection processing of the interconnection points between the antenna coil and the IC element and the moisture-proof treatment and additionally the excellent durability owing to insusceptibility to breakage of coil conductor regardless of stresses induced upon bending, torsion or the like of the substrate.

As a method of forming the antenna coil on the information carrier, a sputtering method is adopted. Thus, the electric conductor of the antenna coil formed integrally with the IC element is implemented in the form of an aluminum-sputtered film.

In this conjunction, it is however noted that when the antenna coil is formed integrally on the IC element, not only the winding diameter and the conductor width of the coil become smaller when compared with the case where the antenna coil composed of the winding is carried on the substrate, but also the number of turns of the coil is naturally limited, making it difficult to increase the range or distance for communication with the reader/writer or rendering it even impossible to ensure the communication range.

The present invention has been made with a view to disposing of the deficiencies of the hitherto known techniques such as mentioned above and hence it is contemplated with the present invention as a technical object to provide an information carrier incorporating an IC element formed integrally with an antenna coil and capable of ensuring an extended communication range or distance and a method of manufacturing the information carrier as well as a structure of the IC element formed integrally with the antenna coil and advantageously suited for employment in the information carrier of this sort and a method of manufacturing the IC element.

SUMMARY OF THE INVENTION

For accomplishing the object mentioned above, the present invention provides an IC element formed integrally with a coil, wherein a conductor constituting the above-mentioned coil is implemented in a multilayer structure including a metal-sputtered layer or alternatively a metal-evaporated layer and a metal-plated layer.

Since the metal-plated layer has an electric resistance value smaller than the metal-sputtered layer or alternatively the metal-evaporated layer, loss of the electromagnetic energy can be diminished by implementing the electric conductor of the coil in a multilayer structure composed of the metal-sputtered layer or alternatively the metal-evaporated layer and the metal-plated layer when compared with the coil conductor constituted solely by the metal-sputtered layer or alternatively the metal-evaporated layer, whereby the distance or range for communication with the reader/writer can be increased.

<IC Element Manufacturing Method>

For achieving the object mentioned previously, there is provided according to a first aspect of the present invention an IC element manufacturing method which includes a step of forming uniformly a metal-sputtered layer or alternatively a metal-evaporated layer on a surface passivation film of a finished wafer manufactured through a predetermined process, a step of forming uniformly a photoresist layer on said metal-sputtered layer or alternatively on said metal-evaporated layer, a step of exposing said photoresist layer to light illumination in a predetermined pattern inclusive of a coil for thereby exposing said metal-sputtered layer or alternatively said metal-evaporated layer in said predetermined pattern after development, a step of laminating a metal-plated layer on exposed portions of said metal-sputtered layer or alternatively said metal-evaporated layer through an electroless plating method or alternatively an electroplating method or alternatively through a precision electroforming method, a step of eliminating the photoresist layer deposited on said finished wafer, a step of forming a predetermined conductor pattern corresponding to said predetermined pattern by etching said metal-sputtered layer or alternatively said metal-evaporated layer exposed through said metal-plated layer, and a step of obtaining a concerned IC element formed integrally with the coil by scribing said finished wafer.

Further, according to a second aspect of the present invention, there is provided a method which includes a step of forming uniformly a photoresist layer on a surface passivation film of a finished wafer manufactured through a predetermined process, a step of exposing in said photoresist layer to light illumination in a predetermined pattern inclusive of a coil for thereby exposing said surface passivation film in said predetermined pattern after develop-ment, a step of mounting the finished wafer undergone the development processing on a sputtering apparatus or a vacuum evaporation apparatus for forming a metal-sputtered layer or alternatively a metal-evaporated layer on exposed portion of said surface passivation film, a step of eliminating the photoresist layer deposited on said finished wafer, a step of laminating a metal-plated layer on said metal-sputtered layer or alternatively said metal-evaporated layer through an electroless plating method or alternatively through an electroplating method, and a step of obtaining a concerned IC element formed integrally with a coil by scribing said finished wafer.

As is apparent from the above, by forming the required electric conductive pattern inclusive of the coil on the finished wafer to thereby obtain the concerned IC element by scribing the finished wafer, the IC element formed integrally with the coil can be manufactured with high efficiency when compared with the case where each of the individual IC elements are formed with a coil, whereby the manufacturing cost can be reduced. Furthermore, it is possible to implement the coils of a uniform thickness with high precision for all the IC elements formed on the wafer, whereby variance or dispersion of the communication characteristics can be suppressed.

Furthermore, it is noted that when the coil is formed for each of the individual IC elements by using the sputtering method or alternatively the vacuum evaporation method and the plating method, there arises a problem concerning the insulation quality of the IC element due to deposition of unnecessary conductors on an outer peripheral portion of the IC element. Of course, when the required electric conductive pattern inclusive of the coil is formed on the finished wafer, the unnecessary conductors may be deposited on the outer peripheral portion of the finished wafer upon sputtering or the like process. However, the outer peripheral portion mentioned just above is intrinsically to be disposed of as the unnecessary portion. Accordingly, there will arise no problem in respect to the insulation quality of the individual IC elements.

<IC>

For achieving the object mentioned previously, the present invention provides an information carrier including a substrate having mounted thereon an IC element formed integrally with an antenna coil, wherein said IC element is disposed at a center portion of said substrate in a planar direction perpendicular to a plane of said substrate.

By disposing the IC element on the substrate at the center portion as viewed in the planar direction of the substrate as mentioned above, the center of the coil formed integrally with the IC element and that of the antenna coil for the reader/writer can be easily aligned to each other. Thus, the coefficient of the electromagnetic coupling between both coils can be increased, whereby the electric power supply to the information carrier from the reader/writer as well as the signal transmission/reception between the reader/writer and the information carrier can be carried out with enhanced reliability. In particular, when the substrate which constitutes the information carrier is shaped in a square shape, a regular-polygonal shape or the like which exhibits no or less directivity relative to the reader/writer, the center of the coil formed integrally on the IC element can be aligned more easily with that of the antenna coil provided for the reader/writer, which allows the information carrier to be handled more facilitatively.

For achieving the object mentioned previously, an IC manufacturing method provided according to a first aspect of the present invention includes a step of bonding together a first strip material having regularly formed therein a number of through-holes in which IC elements can be inserted, respectively, and a second strip material formed with no through-hole, a step of placing and fixing the IC elements each formed integrally with a coil in said through-holes, respectively, a step of bonding together said first strip material and a third strip material having no through-hole, and a step of punching said first to third integrally bonded strip materials to thereby obtain the concerned information carriers each incorporating said IC element.

Further, an IC manufacturing method provided according to a second aspect of the present invention includes a step of placing and fixing coils formed discretely independent of IC elements, respectively, in a number of ring-like recesses formed in a first strip material concentrically around through-holes, which are formed regularly in said first strip material and in which said IC elements can be inserted, respectively, a step of bonding a second strip material having no through-hole onto one surface of said first strip material, a step of placing fixedly said IC elements each formed integrally with a coil in said through-holes, respectively, a step of bonding together said first strip material and a third strip material having no through-hole, and a step of punching said first to third strip materials bonded integrally, to thereby obtain desired information carriers each including the IC element and the coil formed discretely independent of said IC element.

As is apparent from the above, the strip lamination in which the required IC elements (or alternatively the IC elements and the coils) are embedded is manufactured, whereon the concerned or desired information carriers are formed by punching the strip lamination. Thus, the identical information carriers can be manufactured with high efficiency, whereby the cost involved in manufacturing the desired information carriers can be reduced.

Incidentally, in the manufacturing methods according to the first and second aspects described above, the substrate of the information carrier is formed of three members (i.e., the first to third strip members), it is equally possible to implement the substrate for the information carrier with two members by forming the recesses for accommodating the IC elements, respectively, in the first strip material instead of adopting the structure in which the through-holes for accommodating the IC elements, respectively, are formed in the first strip material.

Furthermore, in the manufacturing methods according to the first and second aspects described above, the IC elements (or the IC elements and the coils) are completely embedded internally of the strip materials. However, it is also possible to make the IC elements (or the IC elements and the coils) be exposed exteriorly from one surface of the strip material by sealing off the through-holes or the recesses formed in the strip material with a resin after having placed the IC elements (or the IC elements and the coils) in the through-holes or the recesses, respectively.

Besides, when the IC elements (or the IC elements and the coils) is to be exposed externally of the one surface of the strip material, the substrate of the information carrier can be formed by a single member by forming the recesses for accommodating the respective IC elements (or the IC elements and the coils) in the strip material.

DETAILED DESCRIPTION OF THE PREFERRED EMBODIMENTS

<IC Element>

Figure 1A:
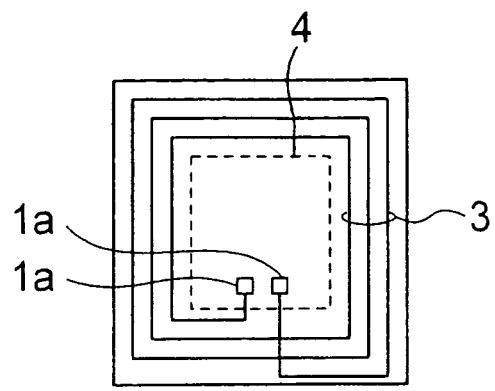
FIGS. 1A, 1B and 1C are plan views showing IC elements according to exemplary embodiments, respectively.
Figure 1B:
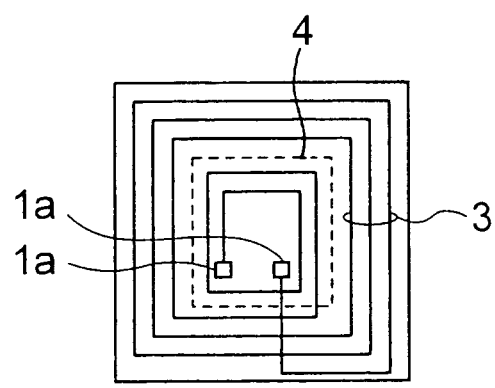
Figure 1C:
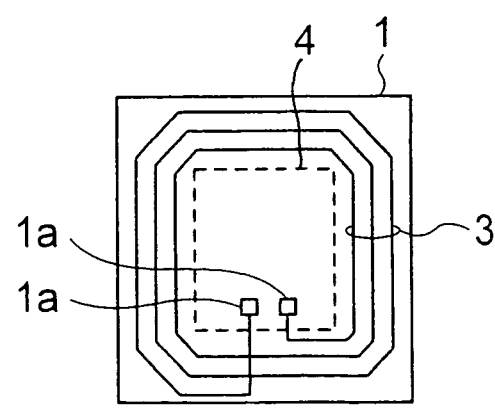
Figure 2A:
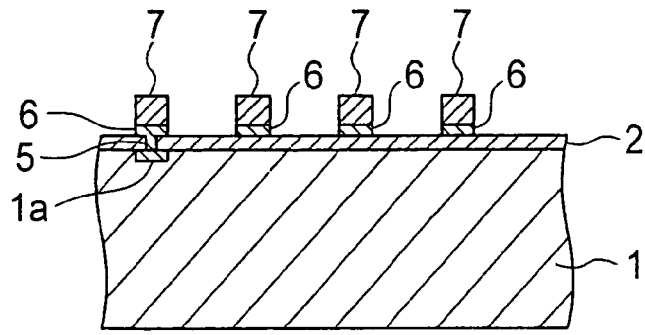
FIGS. 2A and 2B are sectional views showing major portions of IC elements according to exemplary embodiments, respectively.
Figure 2B:
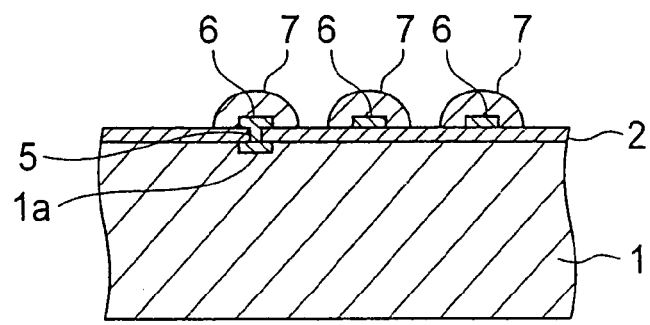

In the following, description will be made of IC elements according to exemplary embodiments of the present invention by reference to FIGS. 1A, 1B and 1C together with FIGS. 2A and 2B, wherein FIGS. 1A, 1B and 1C are plan views showing the IC elements according to the exemplary embodiments, respectively, of the invention and FIGS. 2A and 2B are sectional views showing major portions of the IC elements according to the exemplary embodiments, respectively, of the invention.

As is shown in FIGS. 1A, 1B and 1C and FIGS. 2A and 2B, in each of the IC elements according to the instant exemplary embodiments, an antenna coil 3 of a rectangular spiral pattern is formed integrally on a surface of the IC element 1 in which input/output terminals 1a thereof are formed through the medium of an electrically insulative surface passivation film 2 such as a silicon oxide film, a resin film or the like.

In the case of the IC element 1 shown in FIG. 1A, the antenna coil 3 is formed only in an outer peripheral portion exclusive of a circuit forming portion 4. By virtue of this structure, appearance of stray capacitance between the circuit formed in the IC element 1 and the antenna coil 3 can be prevented, whereby the efficiency of electric power reception from a reader/writer as well as the efficiency of signal transmission/reception with the reader/writer can be enhanced.

In the case of the IC element 1 shown in FIG. 1B, the antenna coil 3 is so formed as to extend over the circuit forming portion 4. With this structure, the number of turns of the antenna coil can be increased, whereby the efficiency of power reception from the reader/writer as well as the efficiency of signal transmission/reception with the reader/writer can be much enhanced.

Incidentally, in the case of the exemplary embodiment shown in FIG. 1B, the antenna coil is overlaid partially on the circuit forming portion 4. However, it is equally possible to form the antenna coil over the whole circuit forming portion 4 with a view to implementing the IC element in a miniature size at low cost.

In the IC element 1 shown in FIG. 1C, corner portions of the antenna coil 3 formed in a rectangular spiral pattern are chamfered obliquely. Owing to this feature, current concentration in the corner portions can be prevented with the resistance value of the antenna coil 3 being thereby decreased, as a result of which the efficiency of power reception from the reader/writer as well as the efficiency of signal transmission/reception with the reader/writer can be much more enhanced. The corner portion may be chamfered arcuately substantially to the same effect. Furthermore, although it is preferred to chamfer both the inner and outer peripheral edge portions of the individual turns, only the outer peripheral edge portions may be chamfered substantially to the similar effect.

In any cases of the antenna coils 3 described above, the line width of the antenna coil 3 should preferably be greater than 7 μm inclusive, the inter-turn distance should preferably be shorter than 5 μm inclusive and the number of turns should preferably be greater than 20 turns inclusive in order to ensure that sufficient electric power can be fed to the antenna coil while realizing desirable characteristics for the communication with the reader/writer in practical applications.

Interconnection of the input/output terminals 1a of the IC element 1 and the antenna coil 3 are made through-holes 5 opened in the surface passivation film 2. In that case, the diameter or width of the through-hole 5 should preferably be sized smaller than the line width of the antenna coil 3, as can be seen in FIGS. 2A and 2B, so that the input/output terminal 1a and the antenna coil 3 can be interconnected without fail even in the case the position at which the antenna coil 3 is formed deviated more or less from that of the antenna coil.

The conductor constituting the antenna coil 3 is implemented in a multilayer structure which includes a metal-sputtered layer or alternatively a metal-evaporated layer 6 and a metal-plated layer 7, as shown in FIGS. 2A and 2B. In the case of the example shown in FIG. 2A, the metal-plated layer 7 is formed only on the top surface of the metal-sputtered layer or alternatively metal-evaporated layer 6. On the other hand, in the case of the example shown in FIG. 2B, the metal-plated layer 7 is so formed as to cover the whole surface of the metal-sputtered layer or alternatively metal-evaporated layer 6. The metal-sputtered layer or alternatively metal-evaporated layer 6 and the metal-plated layer 7 can be formed of a given electrically conductive metal or metals. However, it is preferred to form the metal-sputtered layer or alternatively metal-evaporated layer 6 of aluminum or nickel or copper or chromium because of relatively low cost and high electric conductivity. Further, the antenna coil can be formed in a single layer or in a laminated structure including a combination of plural layers, as can be seen in FIGS. 2A and 2B. The metal-plated layer 7 should preferably be formed of copper by resorting to a non-electrolytic plating method or an electroplating method or a precision electroforming method.

<IC Element Manufacturing Method>

Figure 3:
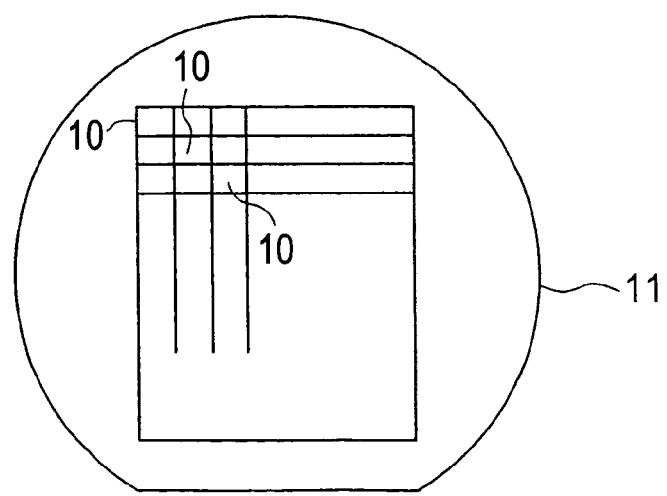
FIG. 3 is a plan view showing a finished wafer.
Figure 4A:
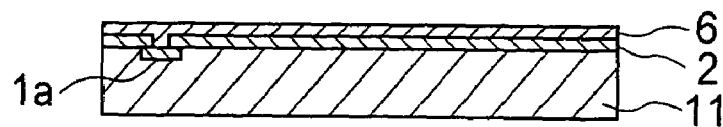
FIGS. 4A, 4B, 4C, 4D, 4E and 4F are views for illustrating stepwise a first example of an IC element manufacturing method according to the present invention.
Figure 4B:
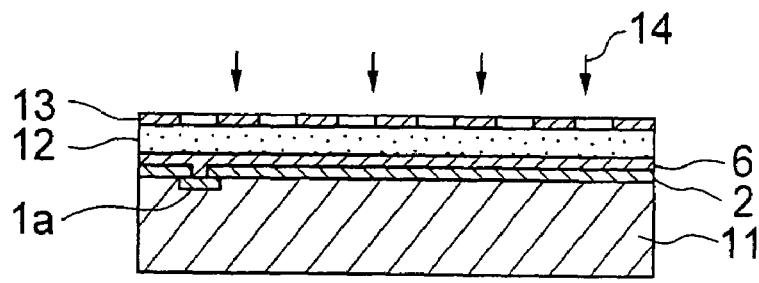
Figure 4C:
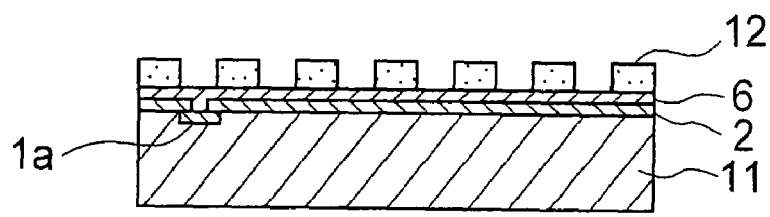
Figure 4D:
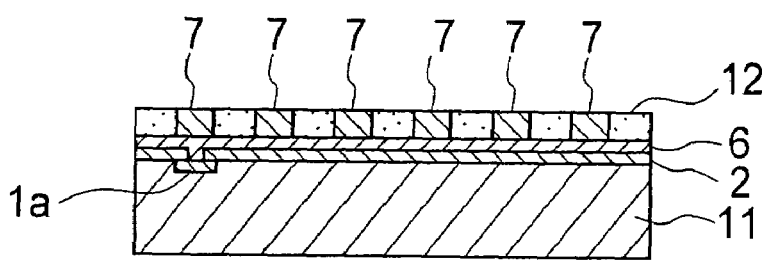
Figure 4E:
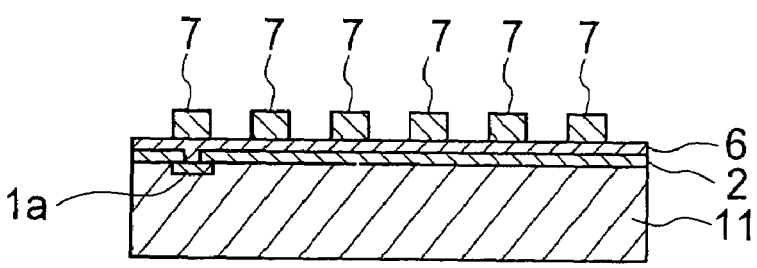
Figure 4F:
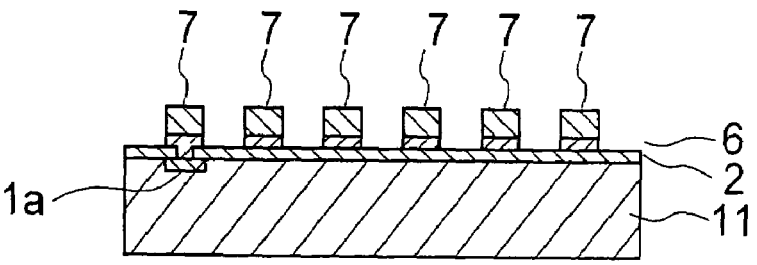
Figure 5A:
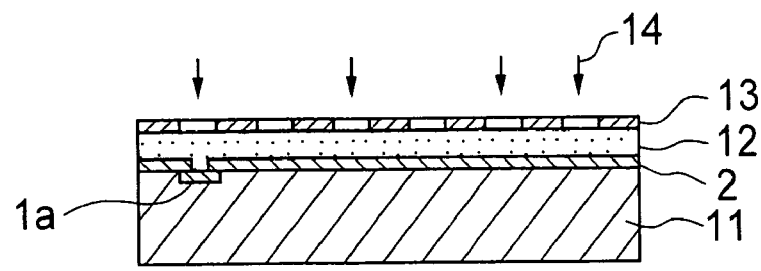
FIGS. 5A, 5B, 5C, 5D and 5E are views for illustrating stepwise a second example of the IC element manufacturing method according to the present invention.
Figure 5B:
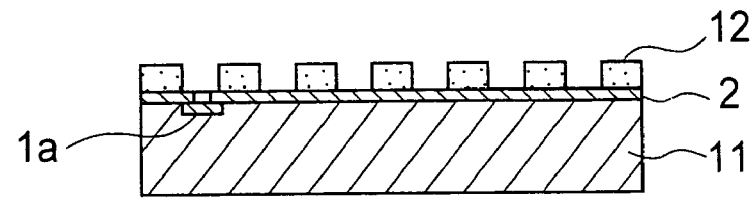
Figure 5C:
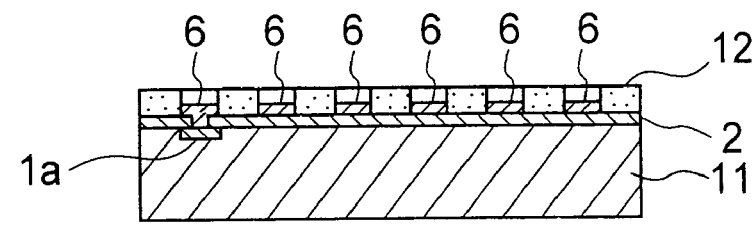
Figure 5D:
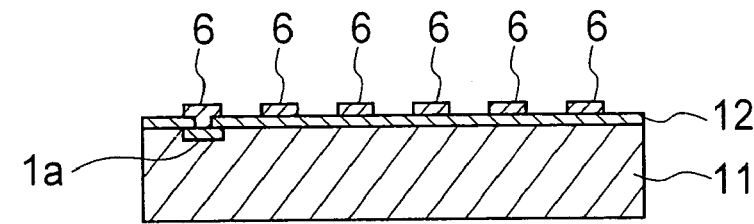
Figure 5E:
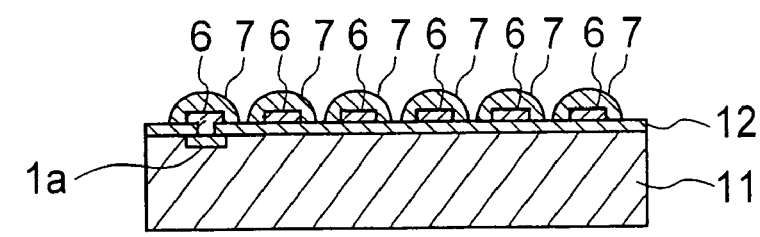
Figure 6:
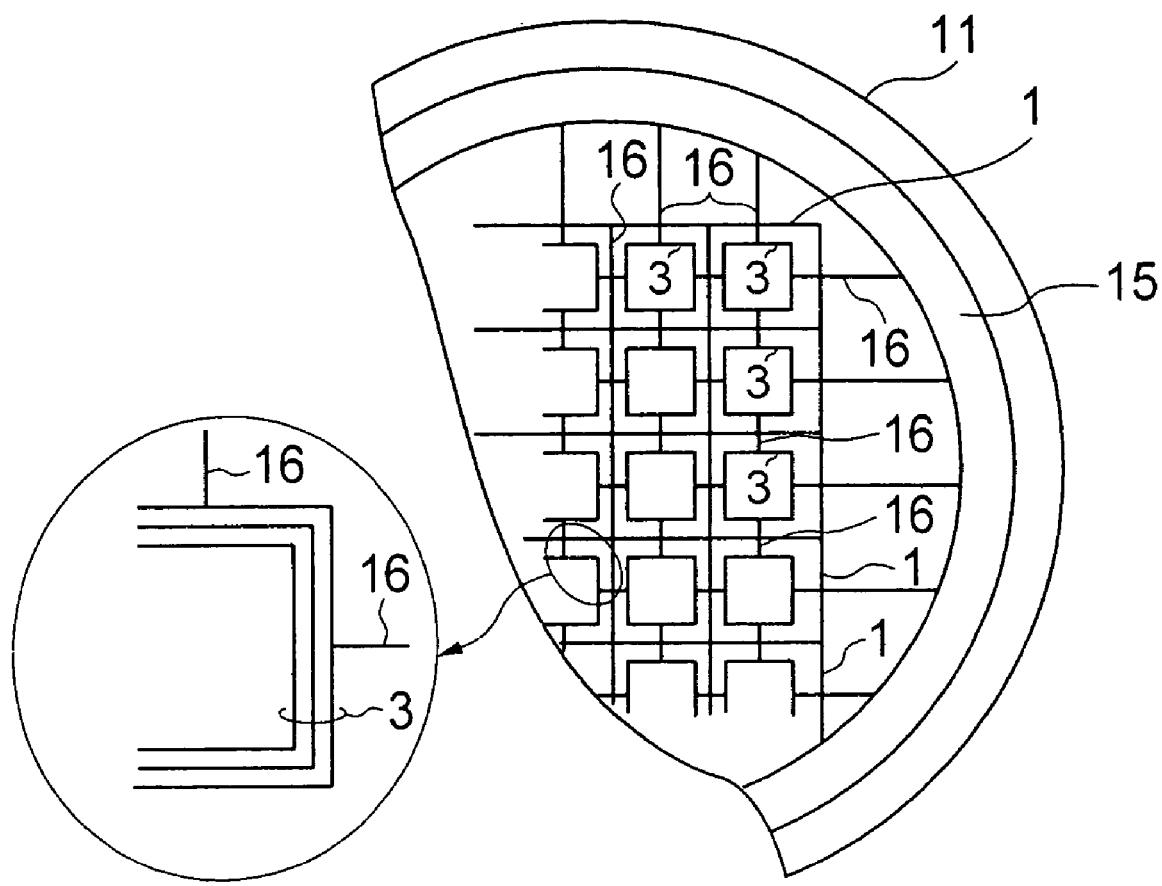
FIG. 6 is a plan view showing a finished wafer having formed thereon a required electric conductive pattern inclusive of an antenna coil.

Next, description will be made of exemplary embodiments of the IC element manufacturing method according to the present invention by reference to FIGS. 3 to FIG. 6, wherein FIG. 3 is a plan view of a so-called finished wafer which has been completed through predetermined treatment processes, FIGS. 4A, 4B, 4C, 4D, 4E and 4F are views for illustrating stepwise a first example of the IC element manufacturing method according to the present invention, FIGS. 5A, 5B, 5C, 5D and 5E are views for illustrating stepwise a second example of the IC element manufacturing method according to the present invention, and FIG. 6 is a plan view of a finished wafer having formed thereon a required conductive pattern inclusive of the antenna coil.

As shown in FIG. 3, a large number of circuits 10 for the IC element are formed with equidistance in an inner portion exclusive of the outermost peripheral portion, wherein the surface passivation film 2 is formed over the surface on which the circuit for the IC element are formed (see FIGS. 4 and 5).

In the IC element manufacturing method according to a first exemplary embodiment shown in FIGS. 4A, 4B, 4C, 4D, 4E and 4F, the metal-sputtered layer or alternatively metal-evaporated layer 6 is formed uniformly on the surface passivation film 2 deposited on the circuit-formed surface of the finished wafer 11 by using aluminum or an aluminum alloy or alternatively copper or a copper alloy, as shown in FIG. 4A. Subsequently, a photoresist layer 12 is uniformly formed on the metal-sputtered layer or alternatively metal-evaporated layer 6 and then the photoresist layer as formed is covered with a mask 13 of a required pattern inclusive of the coils, whereon the photoresist layer 12 is exposed to illumination of light rays 14 of a predetermined wavelength externally of the mask 13, as is shown in FIG. 4B. Thereafter, the photoresist layer 12 undergone the light exposure is subjected to a developing process, whereby the light-exposed portions of the photoresist layer 12 are removed, as a result of which the portions of the metal-sputtered layer or alternatively metal-evaporated layer 6 which correspond to the above-mentioned light exposure pattern is exposed outwardly, as is shown in FIG. 4C. The exposure pattern of the metal-sputtered layer or alternatively metal-evaporated layer 6 includes a ring-shaped electrode portion 15, the antenna coils 3 formed on the portions opposite to the aforementioned circuits 10, respectively, and lead portions 16 for connecting the individual antenna coils 3 and the electrode portion 15, as is shown in FIG. 6. In succession, by making use of the above-mentioned electrode portion 15 as one electrode, electroplating or precision electroforming process is performed on the exposed portions of the metal-sputtered layer or alternatively metal-evaporated layer 6, or thereby laminate the metal-plated layers 7 on the exposed portions of the metal-sputtered layer or alternatively metal-evaporated layer 6, as shown in FIG. 4D. Subsequently, the photoresist layer 12 deposited on the surface of the finished wafer 11 is removed through an ashing or the like process to thereby obtain the finished wafer 11 formed with the metal-plated 7 including the electrode portion 15, the antenna coils 3 and the lead portions 16 deposited on the uniform metal-sputtered layer on alternatively metal-evaporated layer 6, as shown in FIG. 4E. In succession, the metal-sputtered layer or alternatively metal-evaporated layer 6 exposed through the metal-plated layer 7 is selectively etched to thereby remove the metal-sputtered layer or alternatively metal-evaporated layer 6 exposed externally through the metal-plated layer 7, as is shown in FIG. 4F. Thus, there is obtained the finished wafer 11 on which both the metal-sputtered layer or alternatively metal-evaporated layer 6 and the metal plated layer 7 are formed in the required conductive pattern shown in FIG. 6. Finally, the finished after 11 mentioned just above is scribed to obtain the desired IC elements 1 shown in FIG. 1.

Incidentally, in the exemplary embodiment described above, the electroplating method or precision electroforming method is adopted as the process for forming the metal-plated layer 7. It should however be understood that instead of these methods, an electroless plating method may be resorted to for forming the metal-plated layer 7 mentioned above. In that case, since no electrode is required for forming the metal-plated layer 7, it is unnecessary to form the electrode portion 15 and the lead portions 16 upon exposure of the photoresist layer 12 to light illumination.

The electroless plating method is also referred to as the chemical plating and destined for deposition of metal ions by immersing a substrate metal in a bath containing a metallic salt solution of plating metal. The electroless plating method features that a metal-plated layer which exhibits high adhesion and having a uniform and adequate thickness can be formed with relatively simple equipment. The metallic salt mentioned above serves as a supply source of metal ions to be deposited. For plating with copper, a solution of copper sulfate, cupric chloride, copper nitrate or the like is used as the plating solution. The metal ions such as copper ions or the like ions are deposited only on the metal-sputtered layer or alternatively metal-evaporated layer 6 serving as the substrate and not deposited on the electrically insulative surface passivation film 2 (or passivation film). The substrate is required to exhibit less ionization tendency for the plating metal ions and exhibit a catalytic action for deposition of the plating metal ions. Such being the circumstances, when the metal-sputtered layer or alternatively metal-evaporated layer 6 formed of aluminum is to be plated with copper, it is preferred to carry out a pretreatment of forming a nickel film of several m or less in thickness on the surface of the aluminum layer for substituting nickel for zinc by immersing in a zinc nitrate solution for several seconds.

On the other hand, in the electroplating method and the precision electroforming method, the finished wafer 11 having the metal-sputtered layer or alternatively metal-evaporated layer 6 formed thereon and an electrode made of a plating metal are immersed in a plating bath containing plating metal ions, whereon a voltage is applied across the metal-sputtered layer or alternatively metal-evaporated layer 6 formed on the finished wafer 11 and serving as the cathode and the electrode immersed in the plating bath and serving as the anode, to thereby deposit the metal ions contained in the plating bath on the surface of the metal-sputtered layer or alternatively metal-evaporated layer 6. In the electroplating method or the precision electroforming method, a solution of copper sulfate, cupric chloride, copper nitrate or the like is employed as the plating solution for plating with copper.

The IC element manufacturing method according to the instant exemplary embodiment is so arranged that the required conductive pattern inclusive of coils is first formed on the finished wafer 11, whereon the finished wafer 11 is scribed to thereby obtain the desired IC element 1. Thus, the IC elements each formed integrally with the coil can be manufactured with high efficiency at lower manufacturing cost when compared with the case where the individual coils are each formed on the individual IC elements, respectively. Besides, it is possible to form the coils in a uniform thickness, respectively, for all the IC elements formed on the wafer with high precision, as a result of which dispersion or variance of the communication characteristics can be diminished. Furthermore, if the coil is formed for each of the individual IC elements by using the sputtering method or alternatively the vacuum evaporation method and the plating method, unwanted electrical conductor materials will be deposited on the outer peripheral portion of the IC element, giving rise to a problem in respect to the insulation quality of the IC element. Similarly, in the case the required conductive pattern inclusive of the coil is formed on the finished wafer 11, unwanted conductive materials may be deposited on the outer peripheral portion of the finished wafer 11 upon sputtering or the like process. However, since the outer peripheral portion mentioned above is intrinsically destined to be disposed of as the unwanted portion, adverse influence to the insulation quality of the individual IC elements can be avoided. Additionally, in the IC element manufacturing method according to the instant example, the metal-plated layer 7 is formed in the state where the photoresist layer 12 has been deposited, and thereafter the portions of the metal-sputtered layer or alternatively metal-evaporated layer 6 where the metal-plated layer 7 is not laminated are removed by etching. Thus, the metal-plated layer 7 is laminated only on the top surface of the metal-sputtered layer or alternatively metal-evaporated layer 6 without spreading widthwise. Owing to these features, the antenna coil 3 can be formed with high accuracy or precision, which in turn means that the antenna coil 3 having an increased number of turns can be formed within a narrow space.

On the other hand, in the case of the IC element manufacturing method according to a second exemplary embodiment shown in FIG. 5, a photoresist layer 12 is uniformly formed over the surface passivation film 2 formed on the finished wafer 11 and then the photoresist layer 12 as formed is covered with a mask 13 of a required pattern inclusive of coils, whereon the photoresist layer 12 is exposed to illumination of light rays 14 of a predetermined wavelength externally of the mask 13, as is shown in FIG. 5A. Thereafter, the photoresist layer 12 exposed undergoes a developing process, whereby the light-exposed portions of the photoresist layer 12 are removed so that the portions of the surface passivation film 2 which correspond to the above-mentioned light exposure pattern are exposed externally as is shown in FIG. 5B. The light exposure pattern for the photoresist layer 12 can be so formed as to include an electrode portion 15, antenna coils 3 and lead portions 16, as is shown in FIG. 6. Subsequently, the finished wafer 11 undergone the developing process is mounted on a sputtering apparatus or a vacuum evaporation apparatus and then the metal-sputtered layer or alternatively metal-evaporated layer 6 is formed on the exposed portions of the surface passivation film 2 mentioned above, as is shown in FIG. 5C. In succession, the photoresist layer 12 remaining deposited on the finished wafer 11 is removed through the ashing or like process, as is shown in FIG. 5D. Thereafter, by employing the above-mentioned electrode portion 15 as one electrode, electroplating is performed on the metal-sputtered layer or alternatively metal-evaporated layer 6, to thereby laminate the metal-plated layer 7 on the exposed portions of the metal-sputtered layer or alternatively metal-evaporated layer 6, as is shown in FIG. 5E. Finally, the finished wafer 11 mentioned above is scribed for thereby obtaining the desired IC element 1 shown in FIG. 1.

Incidentally, in the exemplary embodiments described above, the electroplating method is adopted as the means for forming the metal-plated layer 7. It should however be understood that instead of such method, an electroless plating method may be adopted for forming the metal-plated layer 7 mentioned above. In that case, since no electrode is required for forming the metal-plated layer 7, it is unnecessary to form the electrode portion 15 and the lead portions 16 upon exposure of the photoresist layer 12 to the light rays.

The IC element manufacturing method according to the instant example can assure the similar advantageous effects as those of the IC element manufacturing method according to the first exemplary embodiment and additionally allows the number of the steps of forming the conductor pattern on the finished wafer 11 to be decreased, whereby the IC element formed integrally with the antenna coil can be manufactured at higher efficiency.

<Information Carrier>

Figure 7:
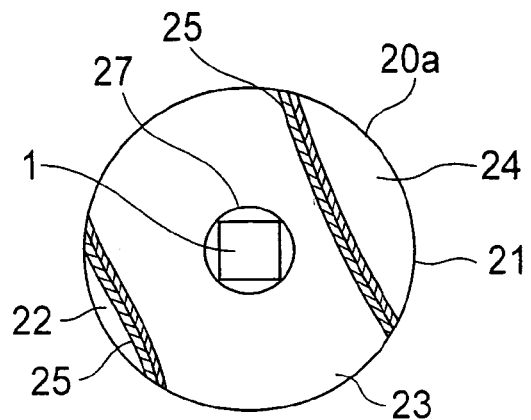
FIG. 7 is a partially broken plan view of an information carrier according to a first exemplary embodiment.
Figure 10:
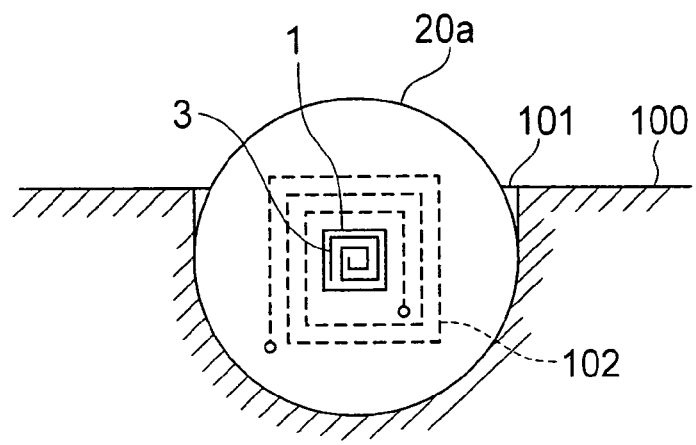
FIG. 10 is a view illustrating the information carrier according to the first exemplary embodiment in the state being used.
Figure 11:
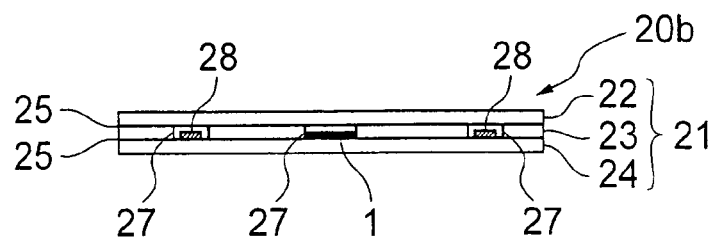
FIG. 11 is a sectional view of an information carrier according to a second exemplary embodiment.
Figure 12:
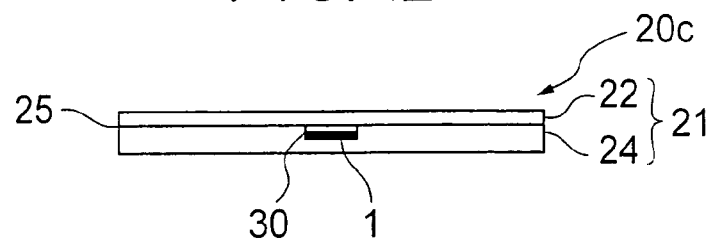
FIG. 12 is a sectional view of an information carrier according to a third exemplary embodiment.
Figure 13:
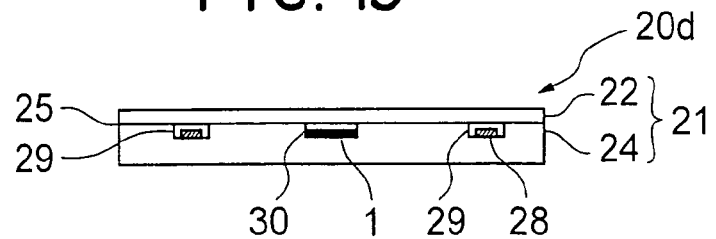
FIG. 13 is a sectional view of an information carrier according to a fourth exemplary embodiment.
Figure 14:
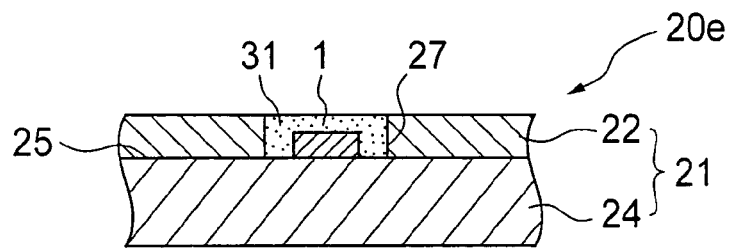
FIG. 14 is a sectional view of an information carrier according to a fifth exemplary embodiment.
Figure 15:
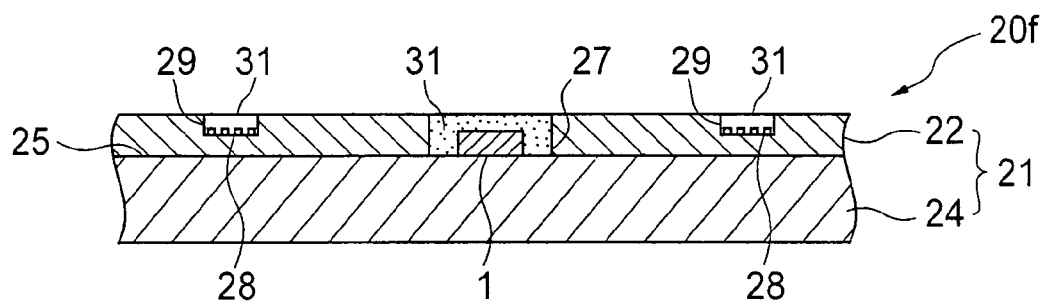
FIG. 15 is a sectional view of an information carrier according to a sixth exemplary embodiment.
Figure 16:
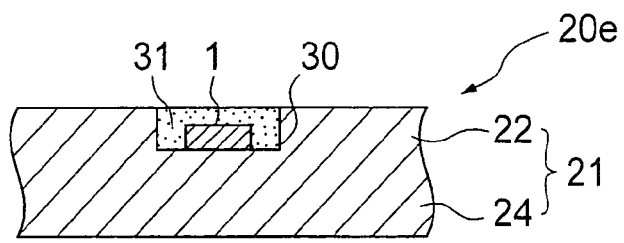
FIG. 16 is a sectional view of an information carrier according to a seventh exemplary embodiment.
Figure 17:
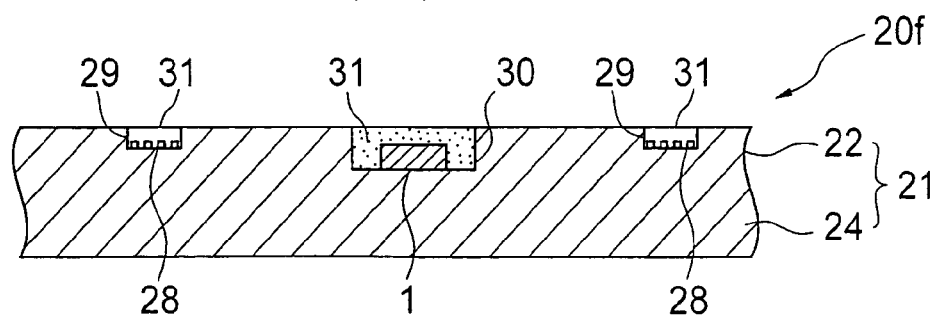
FIG. 17 is a sectional view of an information carrier according to an eighth exemplary embodiment.

In the following, description will be made of information carriers according to exemplary embodiments of the present invention by reference to FIGS. 7 to 17. FIG. 7 is a plan view of an information carrier according to a first exemplary embodiment with a portion being broken away, FIG. 8 is a developed perspective view showing the information carrier according to the first exemplary embodiment, FIG. 9 is a sectional view of the information carrier according to the first exemplary embodiment, FIG. 10 is a view showing the information carrier according to the first exemplary embodiment in the state being used, FIG. 11 is a sectional view of an information carrier according to a second exemplary embodiment, FIG. 12 is a sectional view of an information carrier according to a third exemplary embodiment, FIG. 13 is a sectional view of an information carrier according to a fourth exemplary embodiment, FIG. 14 is a sectional view of an information carrier according to a fifth exemplary embodiment, FIG. 15 is a sectional view of an information carrier according to a sixth exemplary embodiment, FIG. 16 is a sectional view of an information carrier according to a seventh exemplary embodiment, and FIG. 17 is a sectional view of an information carrier according to an eighth exemplary embodiment.

Figure 8:
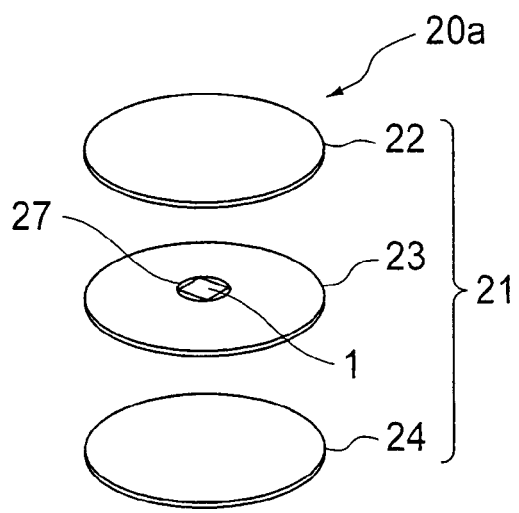
FIG. 8 is a developed perspective view showing the information carrier according to the first exemplary embodiment.
Figure 9:
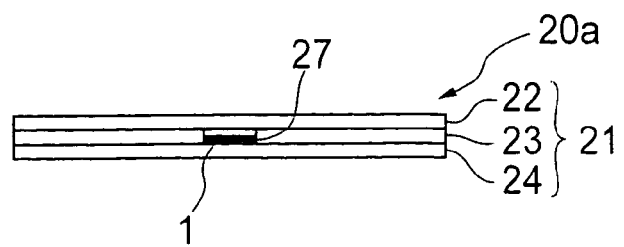
FIG. 9 is a sectional view of the information carrier according to the first exemplary embodiment.

An information carrier 20a according to the first exemplary embodiment is comprised of a coin-like substrate 21 formed circularly in the planar shape and an IC element 1 mounted on the substrate 21 at a center portion as viewed planewise and thicknesswise of the substrate, as is shown in FIGS. 7 to 9. As the IC element 1, the IC element which is formed integrally with the antenna coil, as shown in FIG. 1 and FIG. 2, is employed.

The substrate 21 is composed of a top member 22, an intermediate member 23 and a bottom member 24 which are integrally bonded together through interposed adhesive layers 25, respectively, as is shown in FIG. 8 and FIG. 9. Each of individual members 22, 23 and 24 constituting the substrate 21 may be formed of a paper sheet or a plastics sheet. However, it is preferred above all to form these members of paper sheets, respectively, in consideration of their susceptibility to the spontaneous decomposition after having been scrapped, less generation of harmful gases in incineration and inexpensiveness. Of course, it is possible to form one or two of the members 22, 23 and 24 of a paper sheet with the other one or two members being formed of a plastics sheet.

Formed in the intermediate member 23 at a center portion thereof is a through-hole 27 into which the IC element 1 can be inserted. Thus, by bonding together the members 22, 23 and 24, a chamber in which the IC element 1 can be accommodated is formed. Incidentally, the IC element 1 should preferably be bonded fixedly to the bottom member 24 with a view to protecting the IC element from quaking upon handling of the information carrier. In that case, it is preferred from the standpoint of the manufacturing cost to form uniformly the adhesive layer 25 over one surface of the bottom member 24 so that bonding of the intermediate member 23 and the bottom member 24 on one hand and the bonding of the bottom member 24 and the IC element 1 on the other hand can be realized by making use of the adhesive layer 25. Further, the planar shape of the through-hole 27 may be selected arbitrarily. However, it is preferred from the manufacturing viewpoint to form the through-hole 27 in a circular shape, as shown in FIG. 7 and FIG. 8, because in that case there arises no necessity for precise alignment of orientation of the IC element 1 in the rotational direction with a recess which is formed by bonding together the intermediate member 23 and the bottom member 24, when the IC element is placed in that recess.

By virtue of such arrangement that the IC element 1 is disposed at a center portion of the substrate 21 formed in a circular form as viewed in the planar direction, i.e., perpendicularly to the plane of the substrate, in the case of the information carrier 20a according to the instant exemplary embodiment, the information carrier 20 can be placed within a slot 101 formed substantially semicircularly in a reader/writer 100 equipped with an antenna coil 102 for contactless communication and disposed at a center of an arcuate portion of the slot 101. In that case, the antenna coil 3 formed integrally with the IC element 1 can automatically be centered or aligned with the antenna coil 102 of the reader/writer 100, as can be seen in FIG. 10, whereby the electromagnetic coupling between both the coils 3 and 102 can be increased, as a result of which electric power supply to the information carrier 20 from the reader/writer 100 as well as signal transmission/reception between the reader/writer 100 and the information carrier 20 can be carried out with high reliability. Furthermore, because the information carrier 20a is shaped in a circular form as viewed in the planar direction, i.e., perpendicularly to the plane of the information carrier, the information carrier exhibits no directivity relative to the slot 101 formed substantially semicircularly, whereby excellent handleability of the information carrier can be ensured. Besides, because the IC element 1 is completely embedded within the substrate 21, not only high protection effectivity and excellent durability but also good aesthetic appearance owing to invisibility of the IC element 1 can be ensured for the information carrier.

Referring to FIG. 11, an information carrier 20b according to the second embodiment includes a substrate 21 constituted by a top member 22, an intermediate member 23 and a bottom member 24 and features disposition of a booster coil 28 in a concentric circular array around the IC element 1. In the figure, reference numeral 29 denotes a recess for accommodating therein the booster coil 28, wherein the recess is formed in a ring-like shape around a through-hole 27 of the intermediate member 23. In the other respects, the structure of the information carrier according to the second exemplary embodiment is identical with that of the information carrier 20a according to the first exemplary embodiment. Accordingly, repeated description thereof is omitted. The information carrier 20b according to the instant exemplary embodiment presents similar advantageous effects as those of the information carrier 20a according to the first exemplary embodiment. In addition, by virtue of the concentric circular disposition of the booster coil 28 aground the IC element 1, the electromagnetic coupling between the antenna coil 3 formed integrally with the IC element 1 and the antenna coil 102 of the reader/writer 100 can be increased owing to interposition of the booster coil 28, whereby stabilization of the electric power as well as stabilization of the signal transmission/reception can further be enhanced with the communication range being also increased.

Referring to FIG. 12, an information carrier 20c according to the third exemplary embodiment includes a substrate 21 which is constituted by two members, i.e., a top member 22 and a bottom member 24, and features a recess 30 formed in the bottom member 24 for accommodating therein the IC element 1. In the other respects, the structure of the information carrier 20c according to the third exemplary embodiment is identical with that of the information carrier 20a according to the first exemplary embodiment. Accordingly, repeated description thereof is omitted. The information carrier 20c according to the instant exemplary embodiment presents similar advantageous effects as those of the information carrier 20a according to the first exemplary embodiment. Besides, because the number of the parts constituting the information carrier is small, more inexpensive implementation of the information carrier can be realized.

Referring to FIG. 13, the information carrier 20d according to the fourth exemplary embodiment includes a substrate 21 which is constituted by two members, i.e., a top member 22 and a bottom member 24, and features a first recess 30 formed in the bottom member 24 for accommodating therein the IC element 1 and a second recess 29 formed for accommodating therein a booster coil 28. In the other respects, the structure of the information carrier 20d according to the third exemplary embodiment is identical with that of the information carrier 20c according to the third exemplary embodiment. Accordingly, repeated description thereof is omitted. The information carrier 20c according to the instant exemplary embodiment presents similar advantageous effects as those of the information carrier 20b according to the second exemplary embodiment. Besides, because the number of the parts constituting the information carrier is small, more inexpensive implementation of the information carrier can be realized.

Referring to FIG. 14, the information carrier 20e according to the fifth exemplary embodiment includes a substrate 21 which is constituted by two members, i.e., a top member 22 in which a through-hole 27 for accommodating therein the IC element and a bottom member 24 in which no through-hole 27 is formed, and features that the IC element 1 is accommodated within a recess formed by bonding together the top member 22 and the bottom member 24 with the interior of the recess being sealed off by filling a potting resin 31. In the other respects, the structure of the information carrier 20e according to the fifth exemplary embodiment is identical with that of the information carrier 20a according to the first exemplary embodiment. Accordingly, repeated description thereof is omitted. The information carrier 20e according to the instant exemplary embodiment exhibits similar advantageous effects as those of the information carrier 20a according to the first exemplary embodiment except that the IC element 1 is not covered with the substrate.

Referring to FIG. 15, the information carrier 20f according to the sixth exemplary embodiment features a substrate 21 constituted by two members, i.e., a top member 22 in which a through-hole 27 for accommodating therein the IC element and a recess 29 for accommodating a booster coil are concentrically formed around a through-hole 27 and a bottom member 24 which has neither the through-hole 27 nor the recess 29, wherein the booster coil 28 is placed within the recess 29 with the recess 29 being sealed off with a potting resin 31 while the IC element 1 is accommodated within a recess formed by bonding together the top member 22 and the bottom member 24 with that recess also being sealed off with the potting resin 31. In the other respects, the structure of the information carrier 20f according to the sixth exemplary embodiment is identical with that of the information carrier 20e according to the fifth exemplary embodiment.

Accordingly, repeated description thereof is omitted. The information carrier 20f according to the instant exemplary embodiment exhibits similar advantageous effects as those of the information carrier 20a according to the first exemplary embodiment except that the IC element 1 is not covered with the substrate.

Referring to FIG. 16, the information carrier 20g according to the seventh exemplary embodiment features a substrate 21 constituted by a single member having one surface formed with a recess 30 for accommodating the IC element 1, which recess is sealed off with a potting resin 31 after the IC element 1 has been disposed therein. In the other respects, the structure of the information carrier 20g according to the seventh exemplary embodiment is identical with that of the information carrier 20e according to the fifth exemplary embodiment. Accordingly, repeated description thereof is omitted. The information carrier 20g according to the instant exemplary embodiment presents similar advantageous effects as those of the information carrier 20e according to the fifth exemplary embodiment. Besides, because the number of the parts constituting the information carrier is small, more inexpensive implementation of the information carrier can be realized.

Referring to FIG. 17, the information carrier 20h according to the eighth exemplary embodiment features a substrate 21 constituted by a single member which has one surface formed with a first recess 30 for accommodating therein the IC element 1 and a second recess 29 for accommodating therein a booster coil 28, wherein the IC element 1 is disposed within the first recess 30 mentioned above with this recess being sealed off with a potting resin 31 while the booster coil 28 is accommodated within the second recess 29 mentioned above with this recess being also sealed off with the potting resin 31. In the other respects, the structure of the information carrier 20h according to the eighth exemplary embodiment is identical with that of the information carrier 20g according to the seventh exemplary embodiment. Accordingly, repeated description thereof is omitted. The information carrier 20h according to the instant exemplary embodiment presents similar advantageous effects as those of the information carrier 20f according to the sixth exemplary embodiment. Besides, because the number of the parts constituting the information carrier is small, more inexpensive implementation of the information carrier can be realized.

At this juncture, it is to be mentioned that in the exemplary embodiments described above, the substrate 21 is formed circularly as viewed in the planar direction, i.e., perpendicularly to the plane of the substrate. It should however be appreciated that the substrate may be formed in other appropriate shapes such as square, rectangle, triangle or polygon, etc.

Further, in the case of the information carriers according to the second, fourth sixth and eighth exemplary embodiments, the discrete booster coil 28 is disposed in the through-hole and the recess formed in the substrate 21. It should however be understood that the booster coil 28 can directly be formed on the member constituting the substrate 21 by printing, plating, sputtering or the like process.

Furthermore, by implementing the booster coil 28 with a first coil for performing contactless communication with the IC element and a second coil of a greater capacity than the first coil for performing communication with an external reader/writer with and interconnecting the first and second coils in series to each other, the communication range or coverage can be extended.

<Method of Manufacturing the Information Carrier>

Figure 18:
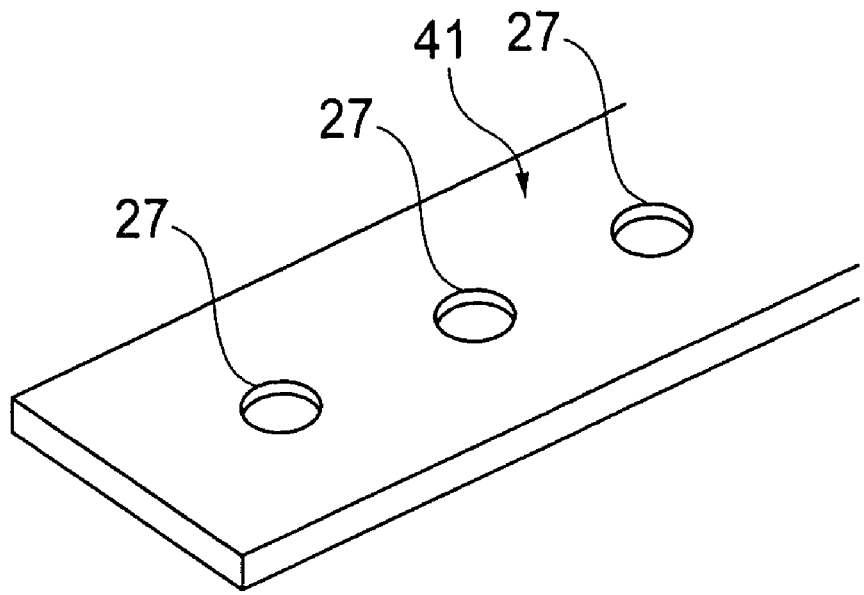
FIG. 18 is a fragmental perspective view showing a first example of a strip material.
Figure 20:
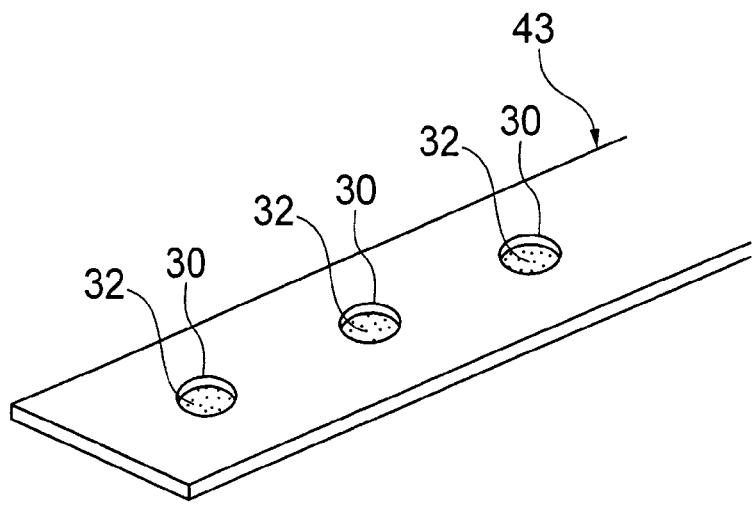
FIG. 20 is a fragmental perspective view showing a third example of the strip material.
Figure 21:
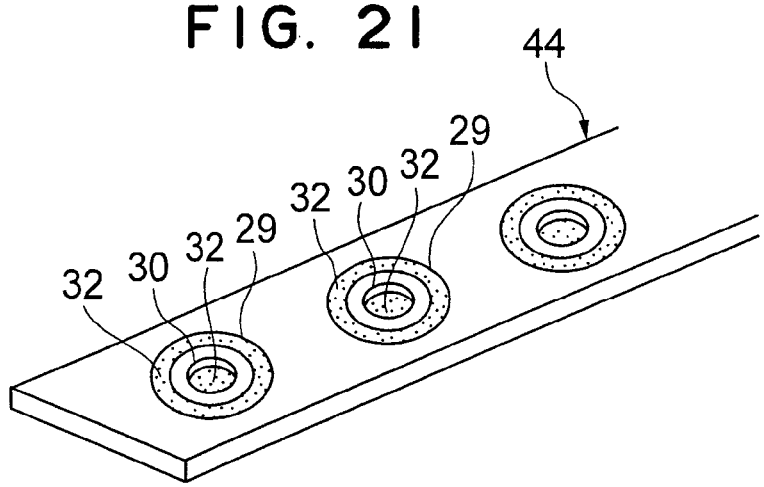
FIG. 21 is a fragmental perspective view showing a fourth example of the strip material.

Next, exemplary embodiments of the information carrier manufacturing method according to the present invention will be described by reference to FIG. 18 to FIG. 22. FIG. 18 is a fragmental perspective view showing a first example of a strip material employed in manufacturing an information carrier according to the present invention, FIG. 19 is a fragmental perspective view showing a second example of the strip material, FIG. 20 is a fragmental perspective view showing a third example of the strip material, FIG. 21 is a fragmental perspective view showing a fourth example of the strip material, and FIG. 22 is a fragmental perspective view showing a fifth example of the strip material.

In the information carrier manufacturing method according to the present invention, required parts to be mounted inclusive of the IC element 1 are disposed fixedly on a raw material (strip material) for implementing a unitary substrate formed in a strip-like shape, whereon other strip material or materials is bonded onto one or both surfaces of the strip material, as the case may be, or alternatively potting for the parts to be mounted are carried out, and thereafter the concerned information carriers are punched by die-cutting from the single or the unitary bonded strip. For carrying out the information carrier manufacturing method according to the present invention, there may be selectively employed a strip material 41 in which through-holes 27 for accommodating the IC elements 1, respectively, are formed with a constant interspace, as shown in FIG. 18, a strip material 42 in which through-holes 27 are formed with a constant interspace for accommodating the IC elements 1, respectively, and in which ring-shaped recesses 29 destined for accommodating booster coils 28, respectively, are formed concentrically around the through-holes 27 with adhesive layers 32 being applied onto bottom surfaces of the ring-shaped recesses 29, respectively, as shown in FIG. 19, a strip material 43 in which recesses 30 are formed with a constant interspace for accommodating therein the IC elements 1, respectively, with an adhesive layer 32 being applied onto a bottom surface of each of the recesses 30, as shown in FIG. 20, a strip material 44 in which first recesses 30 are formed with a constant interspace for accommodating therein the IC elements 1, respectively, and in which second recesses 29 each of a ring-like shape are concentrically formed around the first recesses 30, respectively, with adhesive layers 32 being applied onto the bottom surfaces of the recesses 29 and 30, respectively, as shown in FIG. 21, or a strip material 45 on which neither through-holes nor recesses are formed but an adhesive layer 25 is uniformly applied over one surface of the strip material, as shown in FIG. 22.

Figure 22:
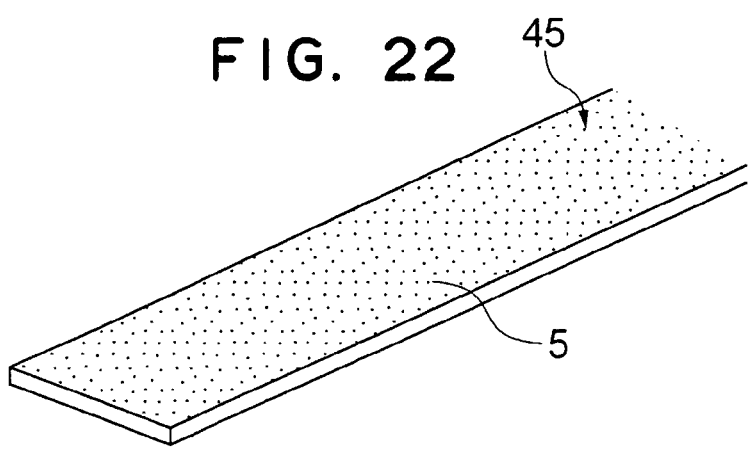
FIG. 22 is a fragmental perspective view showing a fifth example of the strip material.

A first example of the information carrier manufacturing method according to the present invention is destined for manufacturing the information carrier 20a according to the first exemplary embodiment by using one sheet of strip material 41 shown in FIG. 18 and two sheets of strip materials 45 shown in FIG. 22. At first, one of the strip materials 45 is bonded to one surface of the strip material 41 with the adhesive layer 25 being interposed therebetween to thereby obtain a unitary bonded strip composed of the strip materials 41 and 45 having spaces within which the IC elements 1 can be accommodated, respectively. Subsequently, the IC elements 1 are positioned to be placed within the spaces mentioned above, respectively, whereon the IC elements 1 are bonded to the strip material 45 by using the adhesive layers 25, respectively. In succession, the other strip material 45 is bonded to the other surface of the strip material 41 with the adhesive layer 25 interposed therebetween to thereby realize a unitary bonded strip composed of the strip materials 41 and 45 and having the IC elements 1 accommodated within the internal spaces, respectively. Finally, the unitary bonded strip is cut into segments each of a predetermined shape to obtain the information carriers 20a according to the first embodiment. With the information carrier manufacturing method according to the instant exemplary embodiment, a large number of the IC elements 1 are encased internally of the strip materials 41 and 45 and then the concerned information carriers are formed by punching from the bonded strip materials 41 and 45. Thus, the identical information carriers can be manufactured with high efficiency and hence the manufacturing cost of the information carrier can be reduced.

Figure 19:
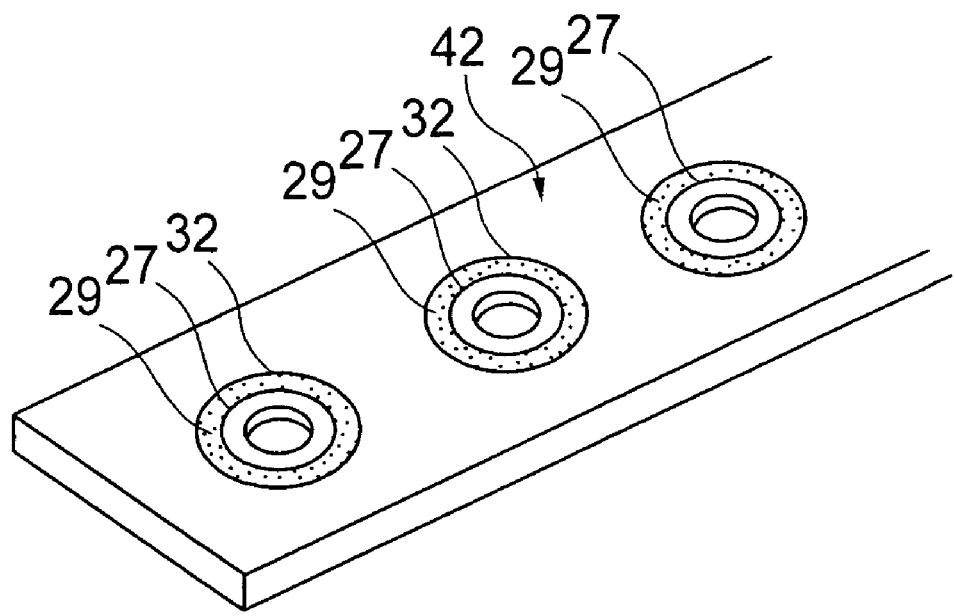
FIG. 19 is a fragmental perspective view showing a second example of the strip material.

A second example of the information carrier manufacturing method according to the present invention is destined for manufacturing the information carrier 20b according to the second exemplary embodiment by using one sheet of the strip material 42 shown in FIG. 19 and two sheets of the strip materials 45 shown in FIG. 22. At first, the booster coils 28 are placed within ring-like recesses 29 formed in the strip material 42 and then the booster coil 28 are bonded to the bottom surfaces of the recesses 29 by using adhesive layers 32, respectively. Subsequently, the strip material 45 is bonded to one of the surfaces of the strip material 42 by using the adhesive layer 25 interposed therebetween to thereby obtain a unitary bonded strip composed of the strip materials 42 and 45 bonded together and having spaces within which the IC elements 1 can be accommodated, respectively. In succession, the IC elements 1 are positioned to be placed within the above-mentioned spaces and bonded to the strip material 45 with the adhesive layer 25. Thereafter, the other sheet of strip material 45 is bonded to the other surface of the strip material 41 with the adhesive layer 25 interposed therebetween to thereby obtain the bonded strip constituted by the strip materials 42 and 45 and having the IC elements 1 accommodated within the internal spaces, respectively. Next, the space within which the IC element 1 has been accommodated is filled with a potting resin 31 to obtain the unitary bonded strip composed of the strip materials 41 and 45 and having the IC elements 1 fixedly embedded therein. Finally, the unitary bonded strip is cut into segments each of a predetermined shape to obtain the information carriers 20e according to the fifth exemplary embodiment. The instant example of the information carrier manufacturing method presents similar advantageous effects as those of the information carrier manufacturing method according to the first embodiment.

A third example of the information carrier manufacturing method according to the present invention is destined for manufacturing the information carrier 20c according to the third exemplary embodiment by using a single sheet of the strip material 43 shown in FIG. 20 and a single sheet of the strip material 45 shown in FIG. 22. At first, the IC elements 1 are positioned to be placed within the recesses 30, respectively, which are formed in the strip material 43 and then the IC elements are bonded to the bottom surfaces of the recesses 30 by using the adhesive layers 32, respectively. Subsequently, the strip material 45 is bonded to the surface of the strip material 43 formed with the recesses by using the adhesive layer 25 interposed therebetween to thereby obtain a unitary bonded strip which is composed of the strip materials 43 and 45 bonded together and having the IC elements 1 embedded therein. Finally, the unitary bonded strip is cut into segments each of a predetermined shape to thereby obtain the information carriers 20c according to the third exemplary embodiment. The instant example of the information carrier manufacturing method presents similar advantageous effects as those of the information carrier manufacturing method according to the first embodiment.

A fourth example of the information carrier manufacturing method according to the present invention is destined for manufacturing the information carrier 20d according to the fourth exemplary embodiment by using a single sheet of the strip material 44 shown in FIG. 21 and a single sheet of the strip material 45 shown in FIG. 22. At first, the IC elements 1 are positioned to be placed within the first recesses 30, respectively, which are formed in the strip material 44, and then the IC elements are bonded to the bottom surfaces of the above-mentioned recesses 30 by using the adhesive layers 32, respectively, while the booster coils 28 are accommodated within the second ring-like recesses 29, respectively, which are formed in the strip material 44 and bonded to the bottom surfaces of the above-mentioned recesses 29, respectively, by using the adhesive layers 32 interposed therebetween. Subsequently, the strip material 45 is bonded to the surface of the strip material 44 having the recesses by using the adhesive layer 25 interposed therebetween to thereby obtain a unitary bonded strip which is composed of the strip materials 44 and 45 bonded together and having internal spaces within which the IC elements 1 have been accommodated, respectively. Finally, the unitary bonded strip is cut into segments each of a predetermined shape to obtain the information carriers 20c according to the third exemplary embodiment. The instant example of the information carrier manufacturing method presents similar advantageous effects as those of the information carrier manufacturing method according to the first embodiment.

A fifth example of the information carrier manufacturing method according to the present invention is destined for manufacturing the information carrier 20e according to the fifth exemplary embodiment by using a single strip material 41 shown in FIG. 18 and a single sheet of strip material 45 shown in FIG. 22. At first, the strip material 45 is bonded to one surface of the strip material 41 with the adhesive layer 25 being interposed therebetween to thereby obtain a bonded strip composed of the strip materials 41 and 45 and having the spaces within which the IC elements 1 can be accommodated, respectively. Subsequently, the IC elements 1 are positioned to be placed within the above-mentioned spaces, respectively, whereon the IC elements are bonded to the strip material 45 by using the adhesive layer 25 interposed therebetween. In succession, the spaces in which the above-mentioned IC elements 1 are accommodated, respectively, are each filled with the potting resin 31 to thereby obtain the unitary bonded strip constituted by the strip materials 41 and 45 and having the IC elements 1 embedded therein. Finally, the unitary bonded strip is cut into segments each of a predetermined shape to obtain the information carriers 20e according to the fifth exemplary embodiment. The instant example of the information carrier manufacturing method equally presents similar advantageous effects as those of the information carrier manufacturing method according to the first embodiment.

A sixth example of the information carrier manufacturing method according to the present invention is destined for manufacturing the information carrier 20f according to the sixth exemplary embodiment by using one sheet of the strip material 42 shown in FIG. 19 and a single sheet of the strip material 45 shown in FIG. 22. At first, the booster coils 28 are placed within the ring-like recesses 29, respectively, which are formed in the strip material 42, and then the booster coils 28 are bonded to the bottom surfaces of the recesses 29 by using the adhesive layers 32, respectively. Subsequently, the strip material 45 is bonded to one of the surfaces of the strip material 42 by using the adhesive layer 25 interposed therebetween to thereby obtain a bonded strip composed of the strip materials 42 and 45 bonded together and having the spaces within which the IC elements 1 can be accommodated, respectively. In succession, the IC elements 1 are positioned to be placed within the above-mentioned spaces, respectively, and bonded to the strip material 45 with the adhesive layer 25 interposed therebetween. In succession, the recesses 29 in which the above-mentioned booster coils 28 are accommodated and the spaces in which the above-mentioned IC elements 1 are accommodated are each filled with the potting resin 31 to thereby obtain the unitary bonded strip constituted by the strip materials 42 and 45 and having the IC elements 1 and the booster coils 28 which are embedded therein. Finally, the unitary bonded strip is cut into segments each of a predetermined shape to obtain the information carriers 20f according to the sixth exemplary embodiment. The instant example of the information carrier manufacturing method equally presents similar advantageous effects as those of the information carrier manufacturing method according to the first embodiment.

A seventh example of the information carrier manufacturing method according to the present invention is destined for manufacturing the information carrier 20g according to the seventh exemplary embodiment by using a single sheet of the strip material 43 shown in FIG. 20. At first, the IC elements 1 are positioned to be accommodated within recesses 30, respectively, which are formed in the strip material 43 and then the IC elements are bonded to the bottom surfaces of the recesses 30, respectively, by using the adhesive layers 32, respectively. In succession, the recesses 30 in which the above-mentioned IC elements 1 are accommodated are each filled with the potting resin 31 to thereby obtain the strip material 43 having the IC elements 1 embedded therein. Finally, this strip material 43 is cut into segments each of a predetermined shape to obtain the information carriers 20g according to the seventh exemplary embodiment. The instant example of the information carrier manufacturing method equally presents similar advantageous effects as those of the information carrier manufacturing method according to the first embodiment.

An eighth example of the information carrier manufacturing method according to the present invention is destined for manufacturing the information carrier 20h according to the eighth exemplary embodiment by using a single sheet of the strip material 44 shown in FIG. 21. At first, the IC elements 1 are positioned to be accommodated within the first recesses 30, respectively, which are formed in the strip material 43 and then the IC elements are bonded to the bottom surfaces of the recesses 30, respectively, by using the adhesive layers 32, respectively, while the booster coils 28 are accommodated within the second ring-like recesses 29, respectively, which are formed in the strip material 44 and then the booster coils are bonded to the bottom surfaces of the recesses 29 by using the adhesive layers 32, respectively. In succession, the first recesses 30 in which the above-mentioned IC elements 1 are accommodated and the second recesses 29 in which the above-mentioned booster coils 28 are accommodated are each filled with the potting resin 31 to thereby obtain the strip material 43 having the IC elements 1 and the booster coils 28 embedded therein. Finally, this strip is cut into segments each of a predetermined shape to obtain the information carriers 20h according to the eighth exemplary embodiment. The instant example of the information carrier manufacturing method equally presents similar advantageous effects as those of the information carrier manufacturing method according to the first embodiment.

Incidentally, in the second, fourth, sixth and eighth exemplary embodiments described above, the booster coil 28 is formed separately or independently from the substrate 21, the booster coil 28 may be formed by printing on any one of the strip materials constituting the substrate 21.

INDUSTRIAL APPLICABILITY

As is apparent from the foregoing description, in the IC element according to the present invention, the electric conductor of the coil formed integrally with the IC element is implemented in a multilayer structure including the metal-sputtered layer or alternatively metal-evaporated layer and the metal-plated layer. Thus, when compared with the IC element in which the electric conductor is formed only of the metal-sputtered layer or alternatively metal-evaporated layer, loss of the electromagnetic energy can be reduced, which can contribute to stabilization of electric power reception from the reader/writer, stabilization of communication with the reader/writer and extension of the communication range relative to the reader/writer.

In the IC element manufacturing method according to the present invention, a large number of coils corresponding to the individual IC elements, respectively, can simultaneously be formed in the finished wafer instead of forming the coil in each of the IC elements. Thus, the IC element formed internally with the coil can be manufactured with high efficiency, as a result of which this sort of IC element can be manufactured at low cost.

In the information carrier according to the present invention, the IC element formed integrally with the coil is disposed at a center portion of the substrate as viewed in the planar direction, i.e., perpendicularly to the plane of the substrate. Thus, the center of the coil formed integrally with the IC element and that of the antenna coil of the reader/writer can easily be aligned with each other, which means that the electromagnetic coupling coefficient between both the coils is increased, whereby the electric power supply to the information carrier from the reader/writer as well as the signal transmission/reception between the reader/writer and the information carrier can be stabilized.

In the information carrier manufacturing method according to the present invention, the unitary strip in which the required parts to be mounted inclusive of the IC elements are mounted on the strip material is manufactured, whereon the concerned information carriers are formed by punching the unitary strip. Thus, the identical information carriers can be manufactured with high efficiency, whereby the cost involved in manufacturing the information carriers each incorporating the IC element can be reduced.

The invention claimed is:

1. A method of manufacturing an IC element, characterized in that said method comprises a step of forming uniformly a metal-sputtered layer or alternatively a metal-evaporated layer on a surface passivation film of a finished wafer manufactured through a predetermined process, a step of forming uniformly a photoresist layer on said metal-sputtered layer or alternatively on said metal-evaporated layer, a step of forming in said photoresist layer a predetermined pattern inclusive of a coil for contactless data communication with external equipment through light exposure and development to thereby expose said metal-sputtered layer or alternatively said metal-evaporated layer through said predetermined pattern, a step of laminating a metal-plated layer on exposed portions of said metal-sputtered layer or alternatively said metal-evaporated layer through an electroless plating method or alternatively an electroplating method or alternatively a precision electroforming method, a step of eliminating the photoresist layer deposited on said finished wafer, a step of forming a predetermined conductor pattern corresponding to said predetermined pattern by etching said metal-sputtered layer or alternatively said metal-evaporated layer exposed through said metal-plated layer, and a step of obtaining concerned IC elements each formed integrally with a coil by scribing said finished wafer.

2. A method of manufacturing an IC element, characterized in that said method comprises a step of forming uniformly a photoresist layer on a surface passivation film of a finished wafer manufactured through a predetermined process, a step of forming in said photoresist layer a predetermined pattern inclusive of a coil for contactless data communication with external equipment through light exposure and development to thereby expose said surface passivation film in said predetermined pattern, a step of mounting the finished wafer undergone a development processing on a sputtering apparatus or alternatively a vacuum evaporation apparatus and forming a metal-sputtered layer or alternatively a metal-evaporated layer on exposed portions of said surface protection film, a step of eliminating the photoresist layer deposited on said finished wafer, a step of forming a metal-plated layer on said metal-sputtered layer or alternatively on said metal-evaporated layer by resorting to an electroless plating method or alternatively an electroplating method, and a step of obtaining concerned IC elements each formed integrally with a coil by scribing said finished wafer.

3. A method for manufacturing an IC element in which antenna for wireless communication is uniformly formed, said method comprising at least steps of:

forming uniformly a conductive pattern at least including plurality of antenna for wireless communication over a surface protection film of a finished wafer formed by a predetermined process; and obtaining an IC element in which at least one antenna is uniformly formed by way of a scriber wafer on which said conductive pattern is formed.

4. A method for manufacturing an IC element in accordance with claim 3, wherein said step of forming a conductive pattern further comprises at least steps of:

forming a metal sputtering layer or a metal deposition layer, and forming metal plating on said metal sputtering layer or metal deposition layer.

5. A method for forming an IC element in an IC element according to claim 4, wherein said metal plating layer is formed by non-electrolytic plating, electrolytic plating or precision electroforming.

* * * * *

UNITED STATES PATENT AND TRADEMARK OFFICE
CERTIFICATE OF CORRECTION

PATENT NO. : 7,129,145 B2 Page 1 of 1
APPLICATION NO. : 10/969902
DATED : October 31, 2006
INVENTOR(S) : Satoshi Kawamura et al.

It is certified that error appears in the above-identified patent and that said Letters Patent is hereby corrected as shown below:

<u>Title Page, Column 1</u>:

The line reading (60) "Provisional application No. PCT/JP00/01029, filed on February 23, 2000" should read
-- (22) PCT Filed: February 23, 2000
(86) PCT No.: PCT/JP00/01029 --.

Signed and Sealed this

Tenth Day of April, 2007

JON W. DUDAS
*Director of the United States Patent and Trademark Office*